United States Patent [19]

Jomura et al.

[11] Patent Number: 5,073,740
[45] Date of Patent: Dec. 17, 1991

[54] LAMINATE-TYPE DISPLACEMENT ELEMENT

[75] Inventors: Shigeru Jomura, Tokyo; Junichi Watanabe, Saitama, both of Japan

[73] Assignee: Hitachi Metals, Ltd., Tokyo, Japan

[21] Appl. No.: 555,668

[22] Filed: Jul. 18, 1990

Related U.S. Application Data

[63] Continuation of Ser. No. 248,520, Sep. 23, 1988, abandoned.

[30] Foreign Application Priority Data

Sep. 25, 1987 [JP] Japan ............................... 62-240503
Jul. 26, 1988 [JP] Japan ............................... 63-186146

[51] Int. Cl.⁵ ........................................... H01L 41/08
[52] U.S. Cl. .................................... 310/358; 310/328; 310/366
[58] Field of Search .................. 310/328, 357-359, 310/363-366

[56] References Cited

U.S. PATENT DOCUMENTS 3,154,700 10/1964 McNaney ............................. 310/328
4,523,121 6/1985 Takahashi et al. ............. 310/358 X
4,845,399 7/1989 Yasuda et al. .................. 310/365 X

FOREIGN PATENT DOCUMENTS 0140173 8/1983 Japan ................................... 310/366
58-196068 11/1983 Japan .
59-32040 8/1984 Japan .
0200778 9/1987 Japan ................................... 310/366
62-211974 9/1987 Japan ................................... 310/328
0035785 2/1990 Japan ................................... 310/366

Primary Examiner—Mark O. Budd
Attorney, Agent, or Firm—Finnegan, Henderson, Farabow, Garrett & Dunner

[57] ABSTRACT

A laminate-type displacement element comprising a plurality of thin plates made of an electromechanical conversion material laminated alternately with internal electrodes which cover substantial portions of said thin plates to form a laminate; a pair of external electrodes connected to said internal electrodes on both sides of said laminate; and a buffer portion extending between a non-deflecting portion located in the vicinity of each side surface of said laminate and a deflecting portion located within said laminate, said buffer portion having a deflection amount which increases gradually from 0% at a position adjacent to the non-deflecting portion to 100% at a position adjacent to the deflecting portion.

10 Claims, 4 Drawing Sheets

LAMINATE-TYPE DISPLACEMENT ELEMENT

This application is a continuation of application Ser. No. 248,520 filed Sept. 23, 1988, now abandoned.

BACKGROUND OF THE INVENTION

The present invention relates to an electromechanical converter for use in actuators of industrial robots, ultrasound motors, etc., and more particularly to an improvement in laminate-type displacement elements constituted by a plurality of thin plates made of electromechanical converting materials laminated with internal electrodes for having larger displacement amounts.

Conventionally, laminate-type displacement elements used in positioning mechanisms and brakes of XY stages are constituted by thin plates made of piezoelectric ceramic materials and having predetermined shapes which are provided with electrodes and polarized and bonded to each other directly or via thin metal plates with an organic adhesive. However, in the laminate-type displacement elements in which the thin plates are laminated by an adhesive, displacement by the vibration of the piezoelectric elements is absorbed by the adhesive under certain conditions, or the adhesive is deteriorated in a high-temperature environment or by use for a long period of time.

Recently, laminate-type piezoelectric elements of such a structure as laminate-type chip capacitors have been put to practical use. Specifically, as described in Japanese Patent Publication No. 59-32040, starting material powder is mixed with a binder to provide a piezoelectric ceramic material paste and formed into a thin plate having a predetermined thickness, and it is coated with an electrically conductive material such as silver-palladium, etc, on one or both sides thereof to form an internal electrode. Predetermined numbers of the thin plates thus coated are laminated, pressed and worked in a predetermined shape and then sintered, and the resulting laminate is equipped with outer electrodes on both sides. The laminate-type piezoelectric element of the above structure is excellent in the adhesion between the thin plates made of a piezoelectric ceramic material and the internal electrodes, and has excellent thermal stability which makes it endurable for use at high temperature and minimizes the deterioration thereof in use for a long period of time.

This laminate-type piezoelectric element, however, has various problems in a piezoelectric displacement efficiency and other points. For instance, as shown in FIG. 11, the laminate-type piezoelectric element is constituted by a plurality of thin plates 1, 1, made of a piezoelectric ceramic material which are laminated alternately with positive and negative internal electrodes 2a, 2b, and each of the internal electrodes 2a, 2b is connected to each external electrode 3a, 3b. In this case, a deflecting portion A is constituted by the plurality of thin plates 1, 1, each coated with the internal electrode, and a non-deflecting portion B is formed in the periphery portion of the laminate constituted by the thin plates 1, 1, where the plurality of internal electrodes 2a, 2b are not attached the thin plates 1, 1, Because of this structure, when voltage is applied to the external electrodes 3a, 3b, an electric field intensity is large only in the deflecting portion A and it is small in the non-deflecting portion B, resulting in hindered deformation of the piezoelectric element. Thus, large displacement inherent in the piezoelectric ceramic material cannot be achieved. In addition, since large strain is concentrated on the boundary between the deflecting portion A and the non-deflecting portion B, the thin plates or the overall element is likely to be broken.

To solve this problem, the applicant proposed a laminate-type piezoelectric element having a structure shown in FIG. 12 (Japanese Patent Laid-Open No. 62-200778). In FIG. 12, the same reference numerals are assigned to the same parts or portions as in FIG. 11. Each thin plate is formed in a shape having a pair of projections 1a on both sides, so that a deflecting portion A in which internal electrodes 2a, 2b are laminated with the thin plates 1 is relatively large. This structure increases the displacement by the same driving voltage by 20-30% as compared to the structure in FIG. 11. However, since it still contains a non-deflecting portion B, it is impossible to completely eliminate the problem that the thin plates are broken along the boundary between the deflecting portion A and the non-deflecting portion B.

As an alternative structure which can prevent the decrease in piezoelectric conversion efficiency due to the existence of the non-deflecting portion B shown in FIGS. 11 and 12, a laminate-type piezoelectric element shown in FIG. 13 was proposed (Japanese Patent Laid-Open No. 58-196068). In FIG. 13, the same reference numerals are assigned to the same parts or portions as in FIGS. 11 and 12.

In FIG. 13, a predetermined number of the internal electrodes 2a, 2b are laminated alternately with thin plates 1 with their overall surfaces covered by the internal electrodes 2a, 2b. A pair of insulating members 4 are attached to both sides of the laminate having the above structure in such a manner that they are in contact with the end of every other internal electrode 2a, 2b (only one internal electrode 2a, 2b on each side), and an external electrode 3a made of a conductive material is attached to each of them. By this structure, the internal electrodes 2a, 2b can exist on the entire surface of each thin plate 1, maximizing the deflecting portion A in the element.

However, since this structure requires that the insulating members 4 be applied to the overall width of the internal electrodes 2a, 2b, complicated procedures for constructing the laminate-type piezoelectric element are needed. In addition, the insulating members 4 should be aligned to the centers of the internal electrodes 2a, 2b. However, since the fluctuations and errors in thickness of the thin plates 1 and/or the internal electrodes 2a, 2b make it difficult to position the insulating members 4 exactly at predetermined locations, insulation breakdown is likely to take place. In addition, when the thin plate 1 is as thin as 100 μm or less, the insulating members 4 which should be applied to every other internal electrode 2a, 2b are liable to cover adjacent internal electrodes 2a, 2b, thereby shutting their connection with the external electrodes 3a, 3b.

As an improvement of the above so-called overall electrode-type laminate-type piezoelectric element, the applicant proposed a laminate-type piezoelectric element shown in FIG. 14 (Japanese Patent Laid-Open No. 62-211974). In FIG. 14, the same reference numerals are assigned to the same parts or portions as in FIGS. 11-13. In FIG. 14, the laminate-type piezoelectric element comprises on one side a pair of insulating members 5, 5 which are provided with external electrodes 3a, 3b having lead portions 6a, 6b. The lead portions 6a, 6b are connected to every other internal electrode 2a, 2b. In this embodiment, the lead portion 6a is electrically connected to the internal electrode 2a, and the lead portion 6b to the internal electrode 2b. This structure is effective for avoiding the insulation breakdown unlike in FIG. 13, but there still remains a difficulty in positioning the lead portions 6a, 6b accurately.

OBJECT AND SUMMARY OF THE INVENTION

An object of the present invention is, therefore, to provide a laminate-type displacement element free from the above problems inherent in the conventional ones and having high piezoelectric conversion efficiency and reliability.

As a result of intense research in view of the above object, it has been found that by providing a laminate constituted by thin plates made of electromechanical conversion material and internal electrodes with buffer portions, each of which has a displacement amount changing continuously or stepwise from a non-deflecting portion to a deflecting portion, an extremely high piezoelectric conversion efficiency can be achieved. The present invention is based on this finding.

Thus, the laminate-type displacement element according to the present invention comprises a plurality of thin plates made of an electromechanical conversion material laminated alternately with internal electrodes which cover substantial portions of the thin plates to form a laminate; a pair of external electrodes connected to the internal electrodes alternately on both sides of the laminate; and a buffer portion extending between a non-deflecting portion located in the vicinity of the side surface of the laminate and a deflecting portion located within the laminate; the buffer portion having a displacement amount which increases gradually from 0% at a position adjacent to the non-deflecting portion to 100% at a position adjacent to the deflecting portion.

DESCRIPTION OF THE PREFERRED EMBODIMENTS

Figure 1:
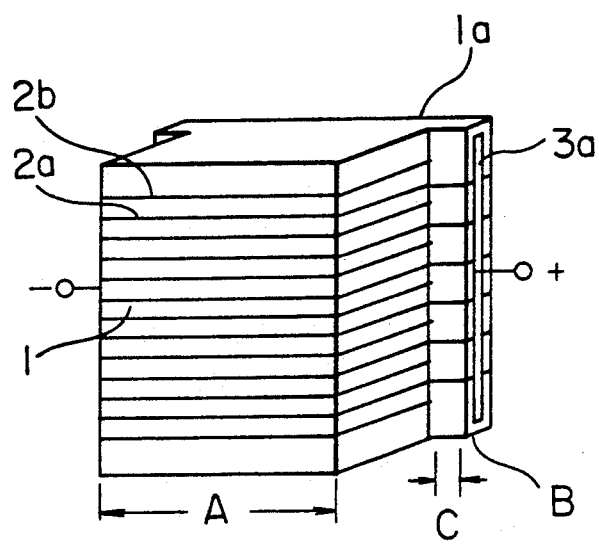
FIG. 1 is a perspective view of the laminate-type displacement element according to one embodiment of the present invention.

Referring to FIG. 1, the laminate-type displacement element comprises a plurality of thin plates 1 laminated alternately with internal electrodes 2a, 2b. The positive and negative internal electrodes 2a, 2b are arranged alternately. A laminate constituted by the thin plates 1 and the internal electrodes 2a, 2b is provided with a pair of projections 1a on both sides. Each projection comprises a buffer portion C extending between a non-deflecting portion B on the side adjacent to an external electrode 3a, 3b and a deflecting portion A constituted by the body of the thin plate 1.

Figure 2:
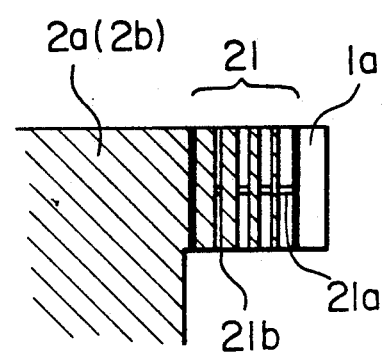
FIG. 2 is an enlarged cross-sectional view showing the buffer portion of the laminate-type displacement element according to one embodiment of the present invention.
Figure 3:
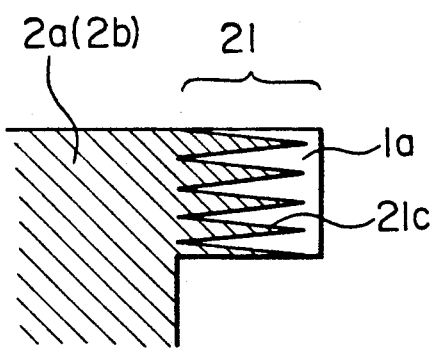
FIG. 3 is an enlarged cross-sectional view showing the buffer portion of the laminate-type displacement element according to another embodiment of the present invention.
Figure 4:
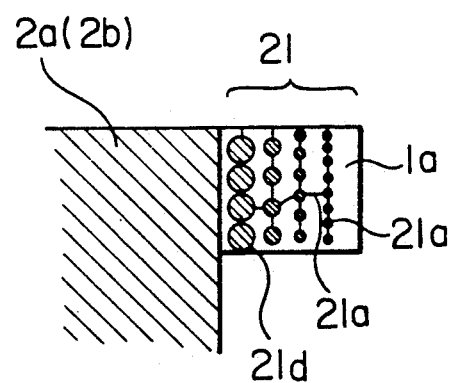
FIG. 4 is an enlarged cross-sectional view showing the buffer portion of the laminate-type displacement element according to a still further embodiment of the present invention.

Referring to FIGS. 2-4, the buffer portion C may have various structures. First, in a first embodiment of the present invention shown in FIG. 2, the buffer portion C is constituted by a partial electrode 21 consisting of a plurality of separate elongated electrode pieces 21b aligned in parallel with the side of the laminate. Please note that the internal electrode 2a (2b) and the partial electrode 21 are hatched in FIG. 2 to make clearer their shapes. In the partial electrode 21, the elongated electrode pieces 21b have widths increasing from a tip end of the projection 1a to a root end thereof adjacent to the internal electrode 2a (2b), and the elongated electrode pieces 21b are connected to each other and to the internal electrode 2a (2b) via an conductive member 21a extending in perpendicular to them.

Because of the above structure, the buffer portion is displaced in proportion to the width of each elongated electrode piece 21b. Since the widths of the elongated electrode pieces 21b increase gradually toward the internal electrode 2a (2b), the amount of displacement decreases gradually from the root portion adjacent to the internal electrode 2a (2b) to the tip end portion. Thus, the buffer portion functions to relieve a strain between the deflecting portion A and the non-deflecting portion B.

FIG. 3 shows a buffer portion C according to a second embodiment of the present invention. This buffer portion C comprises a plurality of elongated triangular electrode portions 21c extending from the internal electrode 2a (2b). Since the width of each elongated triangular electrode portion 21c decreases gradually from a root portion thereof adjacent to the internal electrode 2a (2b) to a tip end thereof, the amount of displacement of the buffer portion 21 containing such elongated triangular electrode portions 21c also decreases gradually.

FIG. 4 shows a buffer portion C according to a third embodiment of the present invention. This buffer portion C comprises a plurality of circular electrode pieces 21d whose diameters decrease gradually from a root portion of the buffer portion C to a tip portion thereof. The circular electrode pieces 21d are connected to each other and to the internal electrode 2a (2b) via conductor members 21a. In this structure, the buffer portion C also has a displacement amount decreasing gradually from the root portion to the tip end portion.

As described above, the buffer portion C serves to prevent a large strain from generating between the deflecting portion A and the non-deflecting portion B, thereby making it unlikely that the thin plates 1 or even the overall element is broken due to the concentration of stress. This is achieved by the fact that the displacement or deflection is 0 at a position adjacent to the non-deflecting portion B (tip end) and increases continuously or stepwise as nearing the deflecting portion (thin plate body) A.

Figure 11:
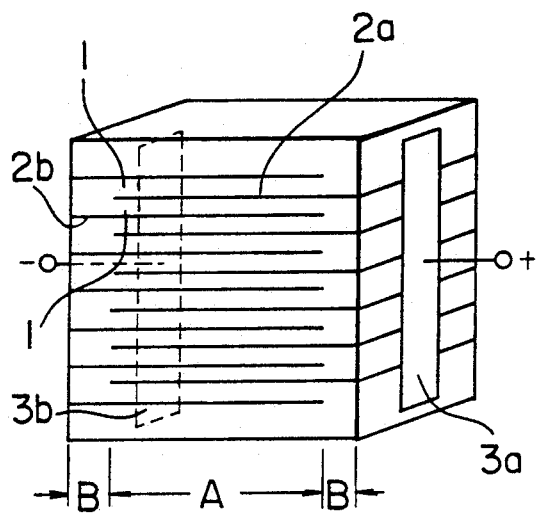
FIGS 11-14 are perspective views showing the conventional laminate-type piezoelectric elements.

In addition to the above embodiments shown in FIGS. 1-4, the present invention is applicable to the laminate-type displacement element shown in FIG. 11.

Figure 5:
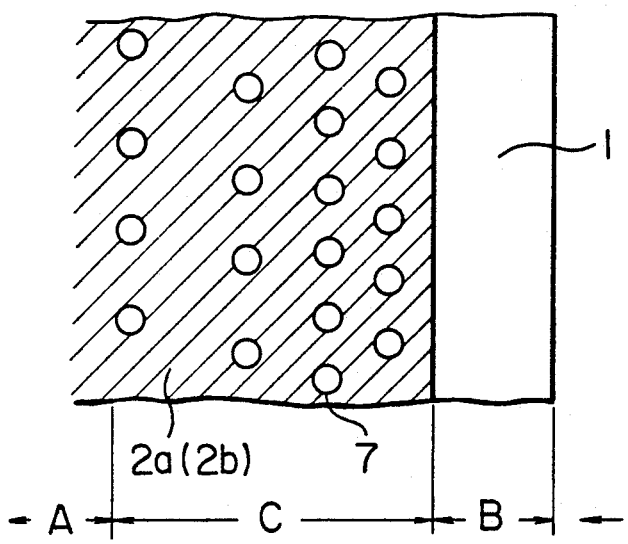
FIG. 5 is an enlarged cross-sectional view showing the buffer portion according to a still further embodiment of the present invention.

FIG. 5 shows a buffer portion C according to a fourth embodiment of the present invention. This embodiment is applicable to the laminate-type displacement element shown in FIG. 11 which does not have a pair of projections as in FIG. 1. In this embodiment, the internal electrode 2a (2b) has in each side portion a plurality of holes 7 arranged such that their density increases toward the side of the internal electrode 2a (2b). This side portion constitutes a buffer portion C. Accordingly, in the buffer portion C, the amount of displacement decreases gradually from the inside adjacent to the deflecting portion A to the outside adjacent to the non-deflecting portion B having no internal electrode 2a (2b).

Figure 6:
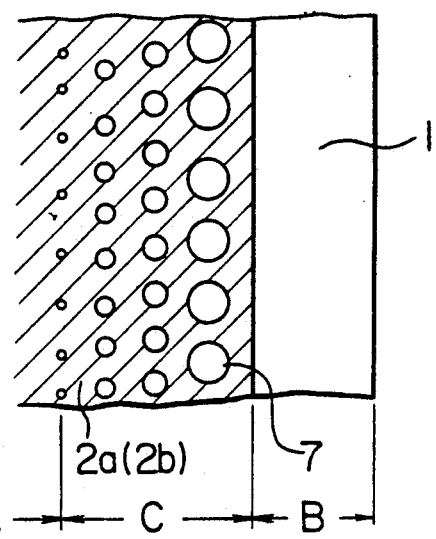
FIG. 6 is an enlarged cross-sectional view showing the buffer portion according to a still further embodiment of the present invention.

In FIG. 5, all holes 7 have the same diameter, but the holes 7 may have different diameters. This is shown in FIG. 6. That is, according to a fifth embodiment of the present invention shown in FIG. 6, the holes 7 have diameters increasing gradually from inside to outside in a buffer portion C. Accordingly, based on the same theory as in FIG. 5, the buffer portion C in FIG. 6 has a displacement amount decreasing gradually from the inside adjacent to the deflecting portion A to the outside adjacent to the non-deflecting portion B. Incidentally, the features of FIG. 5 and 6 may be combined to increase the rate of decreasing the displacement amount.

Such holes 7 can be produced by masking each thin plate in portions corresponding to the holes 7, applying an electrode paste such as a silver-palladium paste to each thin plate by a screen printing method, etc. and then removing the masks.

Figure 7:
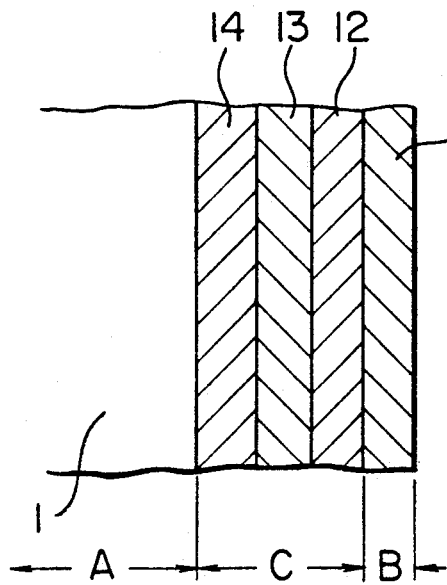
FIG. 7 is a enlarged cross-sectional view showing the buffer portion according to a still further embodiment of the present invention.

FIG. 7 shows a buffer portion C according to a sixth embodiment of the present invention. The buffer portion C extending between a deflecting portion A and a non-deflecting portion B comprises a plurality of laterally elongated thin plates 12, 13, 14. The thin plates 12, 13, 14 have piezoelectric strain constants $d_{12}$, $d_{13}$, $d_{14}$ having the following relation with the piezoelectric strain constant $d_1$ of a thin plate 1 and the piezoelectric strain constant $d_{11}$ of a thin plate 11:

$$d_{11} 21 d_{12} < d_{13} < d_{14} < d_1$$

where $d_{11}$ is nearly 0.

In general, when the buffer portion C is constituted by n thin plates 12-(11+n), each thin plate should have a piezoelectric strain constant satisfying the following relation:

$$d_{11} < d_{12} < \ldots < d_{11+n} < d_1.$$

Therefore the larger the number "n," the smaller the difference in piezoelectric strain constant between adjacent thin plates. By this structure, the buffer portion C has a displacement amount decreasing stepwise or almost continuously from inside to outside.

Incidentally, the difference in piezoelectric strain constant of the thin plates can be achieved by changing their thicknesses. For instance, by slicing a piezoelectric ceramic block by different thicknesses and arranging the thin plates such that their thicknesses decrease from inside to outside, the buffer portion C can be produced.

Figure 8:
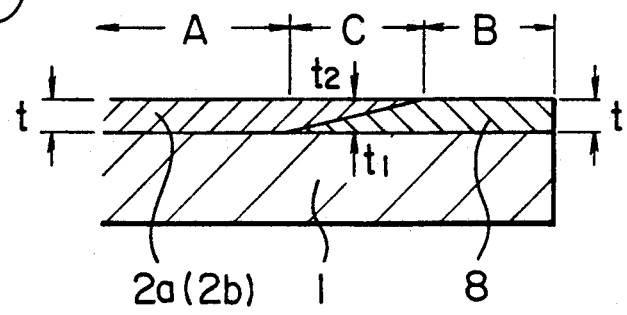
FIG. 8 is an enlarged cross-sectional view showing the thin plate coated with an internal electrode and an insulating layer according to a still further embodiment of the present invention.

FIG. 8 shows a buffer portion C according to a seventh embodiment of the present invention. In this embodiment, a thin plate 1 made of an electromechanical conversion material is coated with an internal electrode 2a(2b) and an insulating layer 8, and in the buffer portion C, the thin plate 1 and the insulating layer 8 overlap each other such that the thin plate 1 becomes thinner while the insulating layer 8 becomes thicker from inside to outside. Assuming that the insulating layer has a thickness $t_1$ and the thin plate 1 has a thickness $t_2$ in the buffer portion C, and that the thin plate 1 has a thickness $t$ in the deflecting portion A, the following relation is satisfied:

$$t_1 + t_2 = t.$$

Because of this structure, the thickness $t_2$ of the internal electrode 2a(2b) varies continuously from 0 at a position adjacent to the non-deflecting portion B to t at a position adjacent to the deflecting portion A, in other words, the thickness $t_1$ of the insulating layer 8 varies continuously from 0 to t reversely. Accordingly, the amount of displacement decreases continuously in the buffer portion C from inside to outside. Incidentally, the thickness $t_2$ of the internal electrode 2a(2b) can be changed stepwise.

Various structures of the buffer portion C have been explained referring to FIGS. 2-8, but it should be noted that any modifications are possible as long as it is satisfied that the amount of displacement decreases continuously or stepwise in the buffer portion C from a position adjacent to the deflecting portion A to the non-deflecting portion B.

In this buffer portion C, since the displacement amount varies gradually, namely continuously or stepwise from 0% at a position adjacent to the non-deflecting portion B to 100% at a position adjacent to the deflecting portion A, buffer action is achieved to relieve a strain which generates due to the difference in displacement amount between the deflecting portion A and the non-deflecting portion B. Accordingly, larger displacement can be obtained in the overall element without causing any problem of breaking or failure in a portion connecting the deflecting portion A and the non-deflecting portion B.

The internal electrode 2a, 2b, the external electrode 3a, 3b and the partial electrode can be produced by any other method than a screen printing method, such as plating method, a vapor deposition method, a coating method, etc.

The electromechanical conversion materials which may be used in the present invention include, in addition to piezoelectric ceramic materials, electrostriction materials having Curie temperatures lower than room temperature which makes polarization unnecessary and also having a large displacement amounts and small hysteresis. Specific examples of such electrostriction materials are:

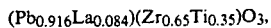

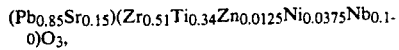

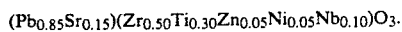

EXAMPLE 1

Pb(Zr,Ti)O$_3$ powder was mixed with polyvinyl butyral as an organic binder, butyl phthalyl butyl glycolate as a plasticizer and trichloroethylene as an organic solvent, and the resulting mixture was case in the form of a sheet having a thickness of 200 μm with a doctor blade. The resulting piezoelectric sheet was then coated with a silver-palladium paste by a screen printing method to form an internal electrode over the entire surface thereof. In this case, the partial electrode pieces shown in FIG. 2 were also formed on the piezoelectric sheet in its portions projecting from its both sides thereby forming a pair of buffer portions. 50 sheets of this structure were laminated and pressed and worked to have a predetermined size. After removing the binder, the resulting laminate was burned at 1050°–1200° C. for 2 hours to provide a laminate-type piezoelectric element of 10 mm × 10 mm × 10 mm. Next, external electrodes 3a, 3b made of a silver paste were applied to the projections. Incidentally, the partial electrode pieces were 5, and their widths decreased from 100 μm to 10 μm equally stepwise.

The laminate-type piezoelectric element was polarized by applying voltage of 400 V for 10 minutes. The laminate-type piezoelectric element was then measured with respect to a displacement amount. The results are shown in FIGS. 9 and 10.

COMPARATIVE EXAMPLE 1

Figure 12:
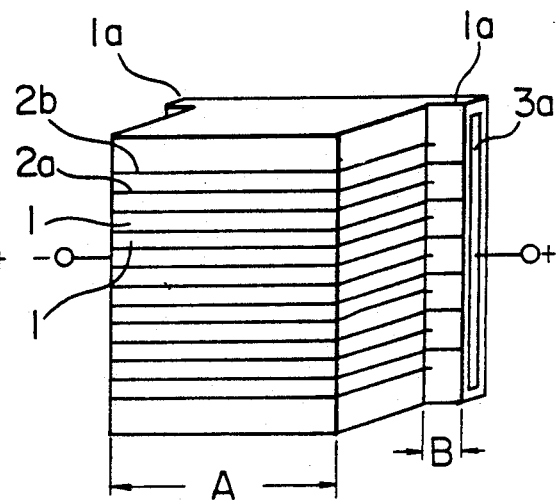
Figure 13:
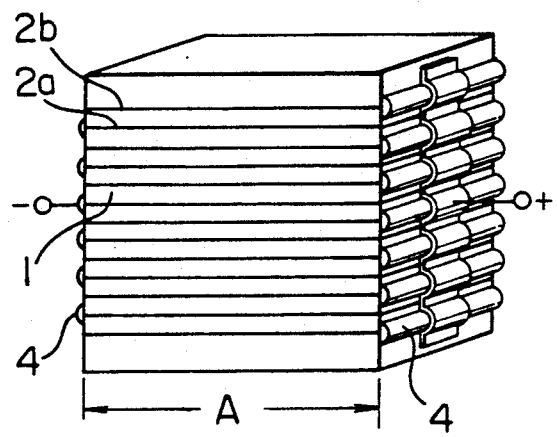
Figure 14:
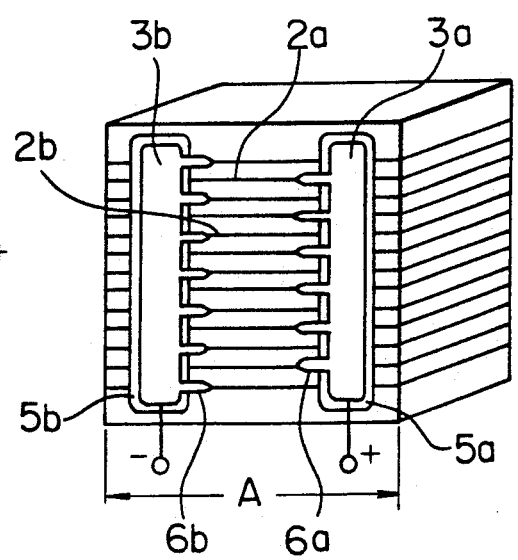

The same procedure as in Example 1 was repeated except for omitting the partial electrode pieces, to produce a laminate-type piezoelectric element shown in FIG. 12. The same measurement was conducted, and the results are shown in FIGS. 9 and 10.

Figure 9:
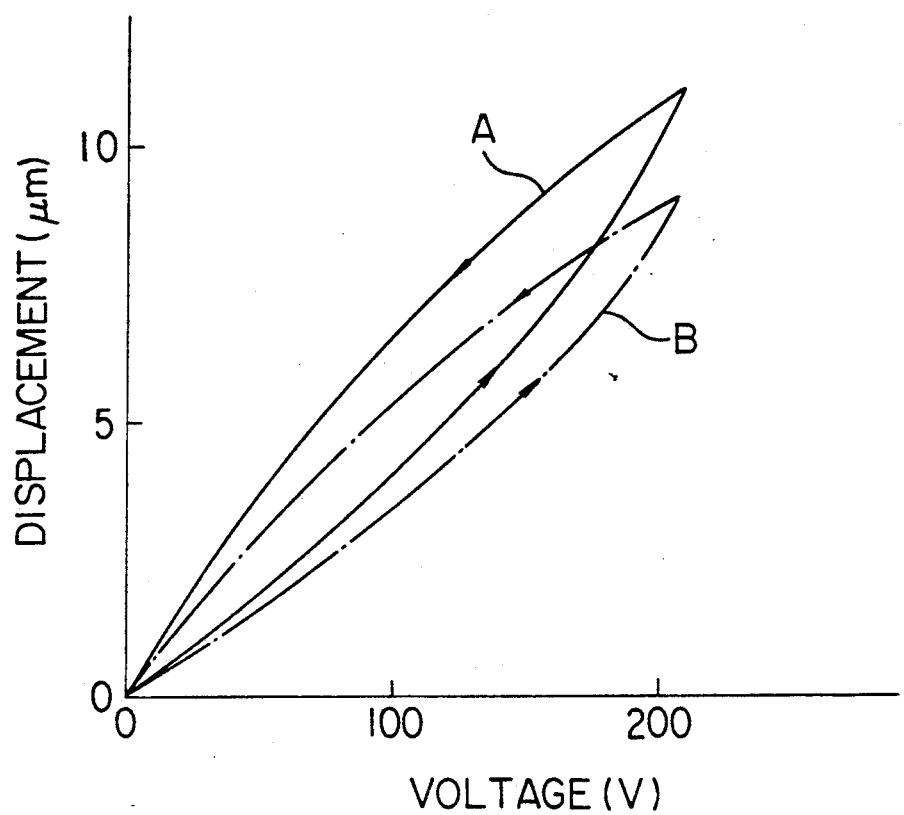
FIG. 9 is a graph showing the relation between displacement amount and applied voltage.
Figure 10:
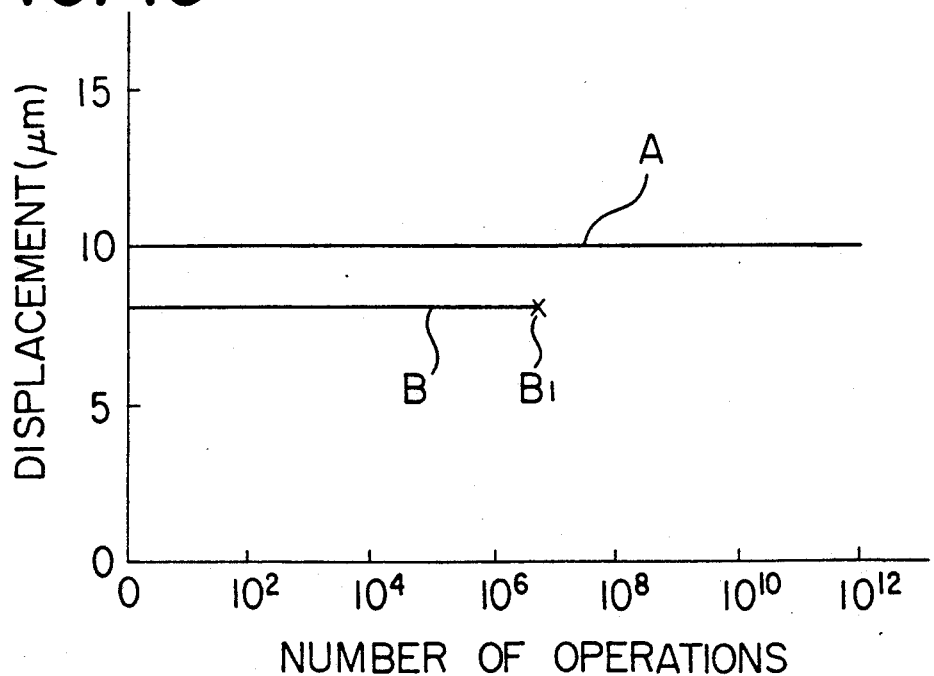
FIG. 10 is a graph showing the relation between displacement amount and the number of operations.

FIG. 9 shows the relation between the displacement amount and the voltage, in which A denotes the laminate-type piezoelectric element of the present invention and B the conventional laminate-type piezoelectric element. It is clear from FIG. 9 that the laminate-type piezoelectric element of the present invention shown a displacement amount higher than the conventional laminate-type piezoelectric element by 20–30%.

FIG. 10 shown the relation between the displacement amount and the number of operations. It is noted that the conventional laminate-type piezoelectric element experienced insulation breakdown at a point B$_1$, which means that the laminate-type piezoelectric element of the present invention enjoys much longer service life than the conventional laminate-type piezoelectric element.

As described above, the laminate-type displacement element of the present invention is free from breakage due to stress concentration, the increase of strain, etc. because of the buffer portion existing between the deflecting portion (piezoelectric thin plate body) and the non-deflecting portion (tip end or side portion). Accordingly, it enjoys a long service life with high reliability.

What is claimed is:

1. A laminate-type displacement element comprising:
    a plurality of thin plates having opposing surfaces made of an electromechanical conversion material laminated with internal electrodes alternately covering portions of said opposing surface of said plates, said plurality of plates stacked to form a laminate having opposing sides;
    a pair of external electrodes connected to said internal electrodes on each of said opposing sides of said laminate; and
    a buffer portion formed within the laminate extending between a non-deflecting portion located in the vicinity of each side of said laminate and a deflecting portion located within said laminate between said portions of said plate surfaces covered by the internal electrodes, said buffer portion having a deflection amount which increases gradually from 0% at a position adjacent to the non-deflecting portion to 100% at a position adjacent to the deflecting portion, and including said internal electrode at a ratio increasing gradually from 0% at a position adjacent to the non-deflecting portion to 100% at a position adjacent to the deflecting portion.

2. A laminate type displacement element comprising:
    a plurality of plates of an electrochemical conversion material, each said plate including opposite first and second surfaces and opposite first and second sides, said first surface being laminated with an internal electrode material extending from said first side to cover a portion of said first surface, said second surface being laminated with an internal electrode material extending from said second side to cover a portion of said second surface, defining a portion of said plate where said internal electrode material disposed on each surface overlaps, said plurality of plates being stacked together with said first and second surfaces of adjoining plates opposing one another to form a stack having opposite first and second side portions and defining a deflecting portion internal to said stack corresponding to said overlapping portions of said plurality of plates having a predetermined deflection amount;
    a first external electrode laminated to said first side portion of said stack, electrically contacting said internal electrodes on said first surfaces of said plurality of plates and defining a first non-deflecting portion at said first side portion of said stack having zero deflection;
    a second external electrode laminated to said second side portion of said stack electrically contacting said internal electrodes on said second surfaces of said plurality of plates and defining a second non-deflecting portion at said second side portion of said stack having zero deflection;
    a first buffer zone disposed between said deflecting portion internal to said stack and said first non-deflecting portion at said first side portion of said stack, said first buffer zone having a deflection amount increasing from zero at said first non-deflecting portion to said predetermined deflection amount at said deflecting portion; and
    a second buffer zone disposed between said deflecting portion internal to said stack and said second non-deflecting portion at said second side portion of said stack, said second buffer zone having a deflection amount increasing from zero at said second non-deflecting portion to said predetermined deflection amount at said deflecting portion.

3. The laminate-type displacement element according to claim 2, wherein said deflection amount in said first and second buffer zones increases at a stepped rate of increase.

4. The laminate type displacement element according to claim 2, wherein said deflection amount in said first and second buffer zones increases at a gradual rate of increase.

5. The laminate-type displacement element according to claim 2, wherein said electromechanical conversion material is a piezoelectric ceramic material.

6. The laminate-type displacement element according to claim 2, wherein said electromechanical conversion material is an electrostriction material.

7. The laminate-type displacement element according to claim 2, wherein said internal electrodes are laminated on said plurality of thin plates by a screen printing method.

8. The laminate-type displacement element according to claim 2, further including an insulating layer and an electrode layer laminated on said buffer portion by a screen printing method.

9. A laminate-type displacement element, comprising:
- a plurality of thin plates having opposing surfaces made of an electromechanical conversion material having a piezoelectric strain constant $d_O$ and laminated with internal electrodes alternately covering portions of said opposing surfaces of said plates, said plurality of plates stacked to form a laminate having opposing sides;
- a pair of external electrodes connected to said internal electrode on each of said opposing sides of said laminate; and
- a buffer portion formed within the laminate extending between a non-deflecting portion located in the vicinity of each side of said laminate and a deflecting portion located within said laminate between said portions of said plate surfaces covered by the internal electrodes, said buffer portion having a deflection amount which increases gradually from 0% at a position adjacent to the non-deflecting portion to 100% at a position adjacent to the deflecting portion, said buffer portion further being made of a material having a piezoelectric strain constant d, with a ratio of $d/d_O$ increasing gradually from 0 at a position adjacent to the non-deflecting portion to 1 at a position adjacent to the deflecting portion.

10. A laminate-type displacement element, comprising:
- a plurality of thin plates having opposing surfaces made of an electromechanical conversion material laminated with internal electrodes having a thickness t alternately covering portions of said opposing surfaces of said plates, said plates stacked to form a laminate having opposing sides;
- a pair of external electrodes connected to said internal electrodes on each of said opposing sides of said laminate; and
- a buffer portion formed within the laminate extending between a non-deflecting portion located in the vicinity of each side surface of said laminate and a deflecting portion located within said laminate between said portions of said plate surfaces covered by the internal electrodes, said buffer portion having a deflection amount which increases gradually from 0% at a position adjacent to the non-deflecting portion to 100% at a position adjacent to the deflecting portion and is coated with an insulating layer having a thickness $t_1$ and an electrode layer having a thickness $t_2$ wherein $t_1 + t_2 = t$, and the thickness $t_1$ of said insulating layer continuously decreases from t at a position adjacent to said non-deflecting portion to 0 at a position adjacent to said deflecting portion.

* * * * *